US009418723B2

(12) United States Patent
Chishti et al.

(10) Patent No.: US 9,418,723 B2
(45) Date of Patent: Aug. 16, 2016

(54) TECHNIQUES TO REDUCE MEMORY CELL REFRESHES FOR A MEMORY DEVICE

(71) Applicant: Intel Corporation, Santa Clara, CA (US)

(72) Inventors: Zeshan A. Chishti, Hillsboro, OR (US); Ishwar Singh Bhati, Hyattsville, MD (US); Shih-Lien L. Lu, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/581,762

(22) Filed: Dec. 23, 2014

(65) Prior Publication Data

US 2016/0180917 A1 Jun. 23, 2016

(51) Int. Cl.
*G11C 7/00* (2006.01)
*G11C 11/406* (2006.01)
*G11C 11/4094* (2006.01)
*G11C 11/4096* (2006.01)

(52) U.S. Cl.
CPC ...... *G11C 11/40611* (2013.01); *G11C 11/4094* (2013.01); *G11C 11/4096* (2013.01)

(58) Field of Classification Search
CPC ............... G11C 11/406; G11C 11/401; G11C 2029/0401; G11C 29/44; G11C 29/4401; G11C 29/848; G11C 11/40611; G11C 11/40603; G11C 11/40622; G11C 2211/4061; G11C 11/40618; G11C 11/40607; G11C 11/4087

USPC .......... 365/222, 230.08, 189.04, 189.14, 201, 365/230.01, 189.07
See application file for complete search history.

(56) References Cited

U.S. PATENT DOCUMENTS

2014/0189215 A1* 7/2014 Kang ............... G11C 11/40603
711/103

OTHER PUBLICATIONS

Liu et al., "RAIDR: Retention-Aware Intelligent DRAM Refresh", presentation, ISCA '2012, 130 pages.
Ghosh et al., "Smart Refresh: An Enhanced Memory Controller Design for Reducing Energy in Conventional and 3D Die-Stacked DRAMs", 40th IEEE?ACM International Symposium on Microarchitecture, MICRO '2007, 12 pages.
Isen et al., "ESKIMO—Energy Savings using Semantic Knowledge of Inconsequential Memory Occupancy for DRAM subsystem", MICRO '2009, 10 pages.

* cited by examiner

*Primary Examiner* — Thong Q Le

(57) ABSTRACT

Examples may include techniques to reduce memory cell refreshes for a memory device. These techniques include a control unit receiving a command to cause an internal refresh counter for the memory device to increment without causing one or more rows of an array of memory cells to be refreshed during an auto-refresh interval. In some examples, a memory controller has access to a refresh counter register at the memory device that may allow the memory controller to determine when to send the command that causes the internal refresh counter to increment without refreshing the one or more rows during the auto-refresh interval.

25 Claims, 13 Drawing Sheets

Command 300

600

```
RECEIVE A COUNTER INCREMENT COMMAND FROM A MEMORY CONTROLLER VIA A
SAME COMMAND-CODE AS RECEIVING AR COMMANDS
602
```

```
INCREMENT A REFRESH COUNTER RESPONSIVE TO THE COUNTER INCREMENT
COMMAND THAT CAUSES ONE OR MORE FIRST ROWS OF AN ARRAY OF MEMORY
CELLS ARRANGED IN ONE OR MORE BANKS TO NOT BE REFRESHED OR SKIPPED
DURING AN AR INTERVAL
604
```

```
STORING A VALUE IN A FIRST REGISTER AT THE MEMORY DEVICE THAT INDICATES A
FIRST COUNT FOR THE REFRESH COUNTER FOLLOWING INCREMENTING OF THE
REFRESH COUNTER, THE FIRST COUNT CAPABLE OF INDICATING REMAINING ROWS
OF THE ARRAY OF MEMORY CELLS TO BE REFRESHED OR SKIPPED DURING THE AR
INTERVAL
606
```

```
RECEIVE A FIRST AR COMMAND
608
```

```
INCREMENT THE REFRESH COUNTER RESPONSIVE TO THE FIRST AR COMMAND THAT
CAUSES ONE OR MORE SECOND ROWS OF THE ARRAY OF MEMORY CELLS TO BE
REFRESHED OR SKIPPED DURING THE AR INTERVAL
610
```

```
UPDATE THE VALUE STORED IN THE FIRST REGISTER AT THE MEMORY DEVICE THAT
INDICATES A SECOND COUNT FOR THE REFRESH COUNTER FOLLOWING
INCREMENTING OF THE REFRESH COUNTER, THE SECOND COUNT TO INDICATE LESS
REMAINING ROWS OF THE ARRAY OF MEMORY CELLS TO BE REFRESHED OR SKIPPED
DURING THE AR INTERVAL AS COMPARED TO THE FIRST COUNT
612
```

ENTER A SR MODE FOR AN ARRAY OF MEMORY CELLS RESPONSIVE TO RECEIVING A FIRST POWER SAVING COMMAND
702

INCREMENT A REFRESH COUNTER BASED ON EACH SR OF RESPECTIVE ONE OR MORE ROWS OF THE ARRAY OF MEMORY CELLS WHILE IN SR MODE
704

UPDATE A VALUE STORED IN THE FIRST REGISTER AT THE MEMORY DEVICE, EACH UPDATED VALUE TO INDICATE A RESPECTIVE COUNT FOR A REFRESH COUNTER FOLLOWING EACH INCREMENTING OF THE REFRESH COUNTER
706

EXIT THE SR MODE RESPONSIVE TO RECEIVING A SECOND POWER SAVING COMMAND
708

RECEIVE A REGISTER READ COMMAND FROM A MEMORY CONTROLLER
710

SEND THE UPDATED VALUE STORED IN THE IN THE FIRST REGISTER ON A DATA BUS ACCESSIBLE TO THE MEMORY CONTROLLER AND THE MEMORY DEVICE
712

RECEIVE A REGISTER WRITE COMMAND HAVING A COUNT VALUE THAT CAUSES THE REFRESH COUNTER TO RESET TO A START COUNT BASED ON THE COUNT VALUE
714

```
SEND, AT A MEMORY CONTROLLER, A REGISTER READ COMMAND TO
ONE OR MORE MEMORY DEVICES THAT REQUESTS A FIRST VALUE
STORED IN A RESPECTIVE REFRESH COUNT REGISTER MAINTAINED AT
EACH OF THE ONE OR MORE MEMORY DEVICES
1302
```

```
RECEIVE THE FIRST VALUE FROM EACH OF THE ONE OR MORE MEMORY
DEVICES
1304
```

```
DETERMINE A FIRST COUNT FOR EACH REFRESH COUNTER USED BY THE
ONE OR MORE MEMORY DEVICES FOR REFRESHING ROWS OF MEMORY
CELLS DURING EACH AR INTERVAL
1306
```

```
SEND A COUNTER INCREMENT COMMAND TO AT LEAST ONE MEMORY
DEVICE FROM AMONG THE ONE OR MORE MEMORY DEVICES USING A
SAME COMMAND-CODE AS USED FOR SENDING AR COMMANDS TO THE
AT LEAST ONE MEMORY DEVICE, THE COUNTER INCREMENT COMMAND
CAUSING ONE OR MORE FIRST ROWS TO BE SKIPPED DURING A FIRST AR
INTERVAL FOR THE AT LEAST ONE MEMORY DEVICE
1308
```

*FIG. 13*

Storage Medium *1400*

Computer Executable Instructions for 1300

FIG. 14

TECHNIQUES TO REDUCE MEMORY CELL REFRESHES FOR A MEMORY DEVICE

TECHNICAL FIELD

Examples described herein are generally related to Dynamic Random Access Memory (DRAM), and more specifically to DRAM refresh schemes.

BACKGROUND

In Dual Data Rate (DDR) memory systems, a memory controller queues auto-refreshes (ARs) to a memory device. During normal operation mode, the controller schedules refreshes in bursts to maximize performance. The memory device may include logic and/or features to maintain an internal refresh counter that tracks bank rows of an array of memory cells that get refreshed. When each AR command is received, the memory device may either increment or decrement the refresh counter.

With increased DRAM densities, the number of total pages to be refreshed increases substantially and, as a result, the overall refresh operation consumes an increasing amount of power. Because the controller must refresh all memory locations, whether or not the location is used for data, much power is wasted on unnecessary refreshes.

BRIEF DESCRIPTION OF THE DRAWINGS

FIG. 6 illustrates an example first logic flow.
FIG. 7 illustrates an example second logic flow.
FIG. 13 illustrates an example of a third logic flow.
FIG. 14 illustrates an example of a storage medium.

DETAILED DESCRIPTION

Figure 1:
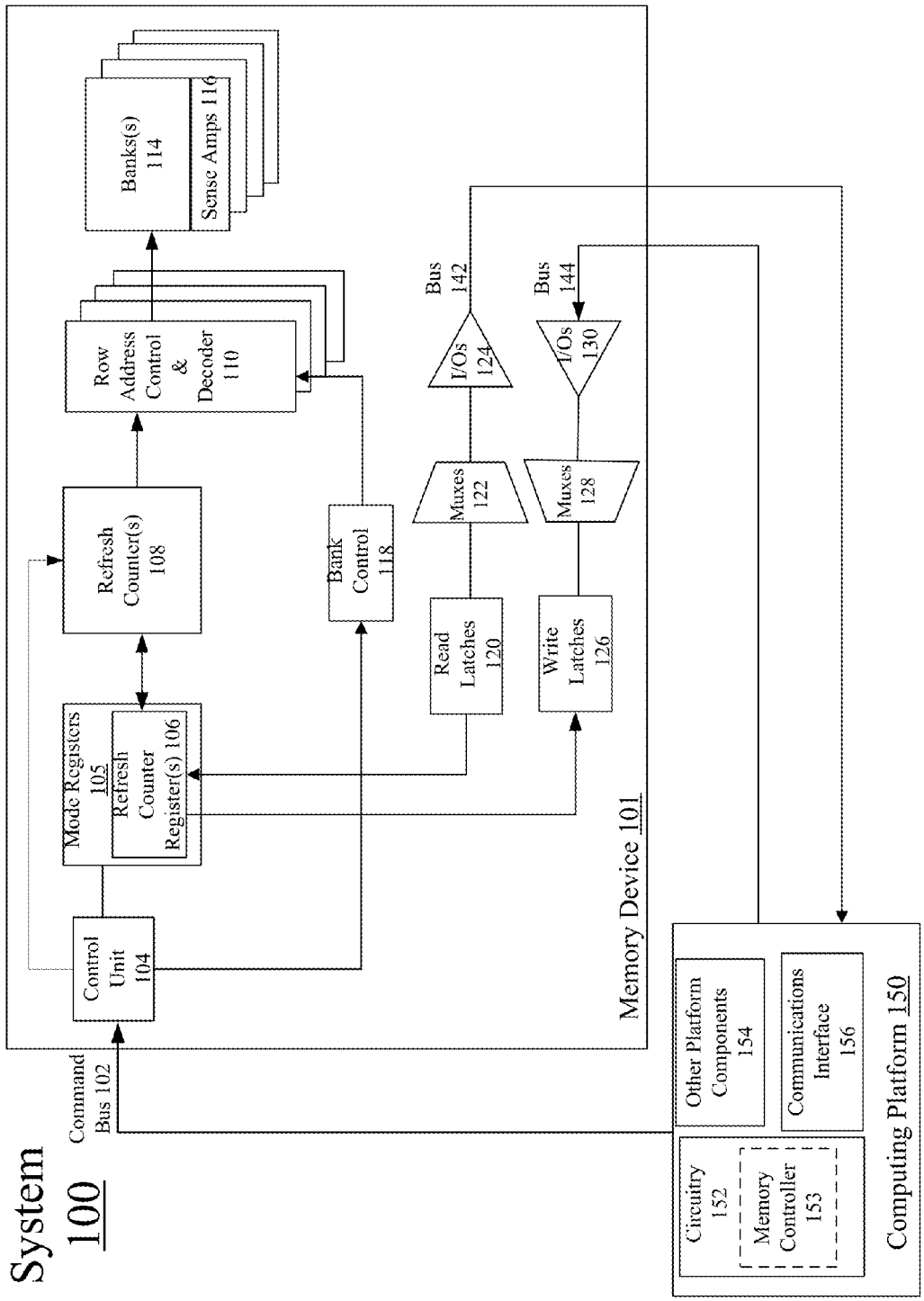
FIG. 1 illustrates an example first system.

As contemplated in the present disclosure partial array self-refresh (PASR) DRAM may be capable of refreshing ¼, ½, or ¾ of a bank of memory to allow for some reduction in power usage due to refresh operations. However, AR schemes implemented by DRAM memory devices designed according to various Joint Electronic Device Engineering Council (JEDEC) specifications may refresh several rows simultaneously without explicitly specifying a starting row address. The JEDEC specifications may include, but are not limited to, dual data rate version 3 (DDR3), originally released by JEDEC in June 2007, currently on release 21, DDR version 4 (DDR4), initial specification published in September 2012 by JEDEC, low power DDR version 3 (LPDDR3), JESD209-3B, published in August 2013 by JEDEC, LPDDR version 4 (LPDDR4), JESD209-4, originally published by JEDEC in August 2014. According to these various JDEC specifications, a memory controller issuing an AR command to a DRAM memory device may have limited responsibilities in a refresh operation. Basically, the memory controller decides when an AR should be scheduled based on a pre-specified AR interval. Logic and/or features at the DRAM memory device then control what rows are to be refreshed and how the overall AR will occur during the pre-specified AR interval.

A solution to address the lack of knowing a starting row address for internal refreshes is to have a memory controller issue an explicit activate (ACT) command with specific row address followed by a precharge (PRE) command to a DRAM memory device. This allows the memory controller to specify when and which row to be refreshed by bringing it into the bank's (externally visible) global row-buffer.

A DRAM memory device may include a refresh counter for which logic and/or features of the DRAM memory device may track rows to be refreshed in a next AR. Device designers for DRAM memory devices have attempted to optimize designs for AR by utilizing knowledge of how a DRAM bank may be internally organized in multiple sub-arrays. Each sub-array may carry out refresh operations independently using only its local row-buffers; therefore a DRAM memory device may schedule several refreshes in parallel to multiple rows of a single bank, thereby reducing both performance and energy penalties of a refresh. However, these parallel refreshes are not possible using ACT/PRE commands. Also, use of ACT/PRE commands to selectively refresh rows may consume large amounts of both power and command bandwidth for refresh operations. Increasing density of DRAM memory devices leads to higher row counts. Higher row counts may increase power usage/command bandwidth to unacceptably high levels for ACT/PRE commands used for selective refresh. It is with respect to these and other challenges that the examples described herein are needed.

Techniques to reduce memory cell refreshes for a memory device may be implemented via one or more example methods. A first example method may include receiving, at a control unit for a memory device, a counter increment command from a memory controller via a same command-code as receiving AR commands that refresh one or more rows of an array of memory cells arranged in one or more banks during an auto-refresh interval. The first example method may also include incrementing a refresh counter responsive to the counter increment command that causes one or more first rows of an array of memory cells arranged in one or more banks to be skipped during an AR interval. The first example method may also include storing a value in a first register at the memory device that indicates a first count for the refresh counter following incrementing of the refresh counter. The first count may be capable of indicating remaining rows of the array of memory cells to be refreshed during the AR interval.

A second example method may include sending, at a memory controller, a register read command to one or more memory devices that requests a first value stored in a respective refresh count register maintained at each of the one or more memory devices. The second example method may also include receiving the first value from each of the one or more memory devices and determining a first count for each refresh counter used by the one or more memory devices for refreshing rows of memory cells during each AR interval. The second example method may also include sending a counter increment command to at least one memory device from among the one or more memory devices using a same command-code as used for sending AR commands to the at least one memory device. The counter increment command may cause one or more first rows to be skipped during a first AR interval for the at least one memory device.

FIG. 1 illustrates an example first system. As shown in FIG. 1, the example first system includes a system 100. In some examples, system 100 is depicted in FIG. 1 as a simplified block diagram for a memory device 101 coupled to a computing platform 150. Memory device 101 may be made up, at least in part, of control unit 104, mode registers 105 having one or more refresh counter register(s) 106, one or more refresh counters 108, one or more row address control and decoder logic units 110, bank control logic 118, one or more arrays of memory cells arranged in one or more bank(s) 114, sense amplifiers (amps) 116, read latches 120, multiplexers (muxes) 122/128, I/O buffers 124/130 and write latches 126. Memory device 101 may also include several external interfaces, including but not limited to an external control interface, or command bus 102, and an interface for reading from or writing to refresh counter register(s) 106 at mode registers 105 via bus 142 or bus 144. The exact arrangement and configuration of components within memory device 101 may be reduced, augmented, or otherwise altered without departing from the spirit and scope of the present disclosure.

Refresh counter register(s) 106 may be capable of storing one or more values indicating count(s) for refresh counter(s) 108. In some examples, the one or more values stored in refresh counter registers 106 may indicate count(s) for refresh counter(s) 108 following incrementing of refresh counter(s) 108. As described in more detail below, a refresh counter such as refresh counter(s) 108 may be incremented responsive to a control unit for a memory device such as control unit 104 receiving an increment, auto-refresh (AR) or ACT/PRE commands from a memory controller such as memory controller 153 located at computing platform 150.

Each refresh counter of refresh counter(s) 108 may correspond to one memory bank of bank(s) 114. For example, in an eight bank memory system, there may be eight refresh counters included in refresh counter registers(s) 106. Also, each refresh counter register of refresh counter register(s) 106 may correspond to one refresh counter(s) 108. For example, in an eight bank memory system that has eight separate refresh counters, there may be eight refresh counter registers included in refresh counter registers(s) 106.

According to some examples, control unit 104 may receive a counter increment command via command bus 102 from a memory controller such as memory controller 153. For these examples the counter increment command may serve as a "dummy-refresh" to cause control unit 104 to increment refresh counter(s) 108 and cause one or more rows of a memory array at bank(s) 114 to be skipped or not refreshed during an AR interval. Refresh counter register(s) 106 may be capable of storing a value that indicates a count for refresh counter(s) 108 following incrementing. In some examples, the count may indicate remaining rows of the memory array at bank(s) 114 to either be refreshed or skipped during the AR interval. For these examples, the AR interval may be a predetermined time for which a plurality of counter increment, AR or ACT/PRE commands may be received by control unit 104 from memory controller 153.

In some examples, refresh counter register(s) 106 may be readable and writable data storage elements. As shown in FIG. 1, refresh counter register(s) 106 may be implemented as part of mode registers 105.

The refresh counter register(s) 106 may be written to by an external device (e.g., memory controller 153) or by control unit 104. Refresh counter (REFC) values stored at refresh counter register(s) 106 may be programmed by an external device such memory controller 153 over bus 144. The REFC values may be received at I/O buffers 130, which may be coupled to muxes 128 and write latches 126. The write latches may be coupled to the refresh counter register(s) 106. REFC values in refresh counter register(s) 106 may be set based upon data received at the I/O buffers (130) via bus 144.

According to some examples, REFC values may be written to refresh counter register(s) 106 over an address bus. For these examples, the REFC values may be stored on a per-bank basis over the address bus. For example, both an REFC value and a bank may be specified when programming refresh counter register(s) 106.

In some examples, REFC values for all banks may be programmed in refresh counter register(s) 106 over a data bus via receipt of an REFC write command. For these examples, the REFC values stored in each refresh counter register(s) 106 may be sent over bus 142 in one burst write operation to elements of computing platform 150 such as memory controller 153. The data write path may be optimized for timing.

According to some examples, after REFC value(s) have been programmed into refresh counter register(s) 106 by control unit 104 and/or an external device responsive to an REFC write command. For these examples, REFC values indicated in the REFC write command may be placed from refresh counter register(s) 106 to respective refresh counter(s) 108. The REFC values may be capable of indicating the next row that may be either refreshed or skipped during a refresh cycle or AR interval.

In some examples, refresh counter register(s) 106 may be readable as well. For example, when a REFC read command to read a refresh start/end register is received by control unit 104 and/or an external device, the current refresh counter value is placed in refresh counter register(s) 106 before it is read. This allows access to an REFC value that is capable of indicating a next row to be either refreshed or skipped.

REFC values may be read from refresh counter register(s) 106 over a bus 142. Bus 142 may be an address bus or a data bus. In the case where bus 142 is an address bus, the address bus may be a bi-directional bus. Where bus 142 is a data bus, the REFC values may be multiplexed on the read data path to optimize the read timing path.

In some examples, as shown in FIG. 1, computing platform 150 may include a processing component 152, other platform components 154 or a communications interface 156. According to some examples, computing platform 150 may be part of a host computing platform coupled to one or more memory devices such as memory device 101 as mentioned above.

According to some examples, circuitry 152 may execute processing operations or logic for memory controller 153 and other elements of computing platform 150. Circuitry 152 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, device drivers, system programs, software development programs, machine programs, operating system software, middleware, firmware, software components, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 154 may include common computing elements or circuitry, such as one or more processors, multi-core processors, co-processors, memory units, chipsets, controllers, peripherals, interfaces, oscillators, timing devices, video cards, audio cards, multimedia input/output (I/O) components (e.g., digital displays), power supplies, and so forth. Examples of memory units may include without limitation various types of computer readable and machine readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory), solid state drives (SSD) and any other type of storage media suitable for storing information.

In some examples, communications interface 156 may include logic and/or features to support a communication interface. For these examples, communications interface 156 may include one or more communication interfaces that operate according to various communication protocols or standards to communicate over direct or network communication links. Direct communications may occur via use of communication protocols or standards described in one or more industry standards (including progenies and variants) such as those associated with the SMBus specification or the PCI Express specification. Network communications may occur via use of communication protocols or standards such those described in one or more Ethernet standards promulgated by the Institute of Electrical and Electronics Engineers (IEEE). For example, one such Ethernet standard may include IEEE 802.3-2008, Carrier sense Multiple access with Collision Detection (CSMA/CD) Access Method and Physical Layer Specifications, Published in December 2008 (hereinafter "IEEE 802.3").

According to some examples, communications interface 156 may also include logic and/or features for memory controller 153 to communicate with control unit 104 of memory device 101. For these examples, communications interface 156 may include one or more communication interfaces that operate according to various communication protocols or standards such as the JEDEC specifications that may include, but are not limited to those for memory device designed according to DDR3, DDR4, LPDDR3 or LPDDR4 specifications.

Computing platform 150 may be part of a host computing platform that may be, for example, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 150 described herein, may be included or omitted in various embodiments of computing platform 150, as suitably desired.

The components and features of computing platform 150 may be implemented using any combination of discrete circuitry, application specific integrated circuits (ASICs), logic gates and/or single chip architectures. Further, the features of computing platform 150 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the example memory device 101 or computing platform 150 shown in the block diagram of FIG. 1 may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in examples.

Figure 2:
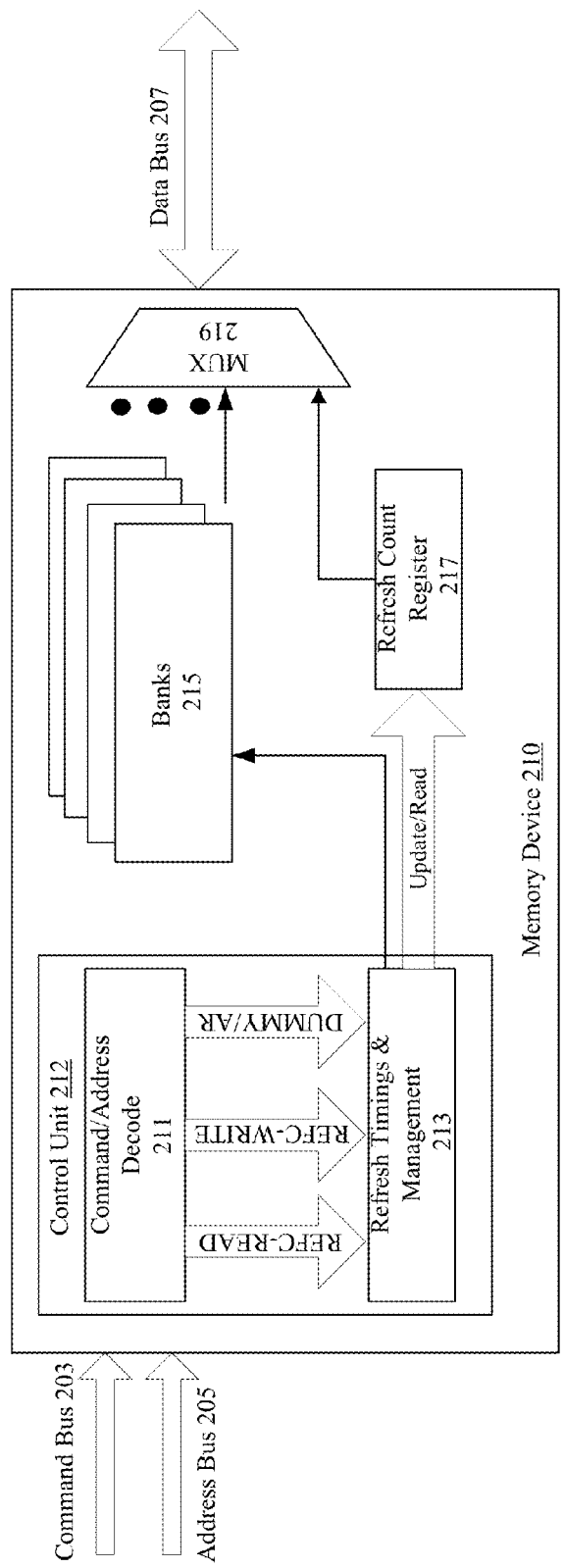
FIG. 2 illustrates an example second system.

FIG. 2 illustrates an example second system. As shown in FIG. 2, the example second system includes a system 200. In some examples, as shown in FIG. 2, system 200 includes a memory device 210 having a control unit 212. For these examples, control unit 212 may include command/address decode 211 and refresh timing & management 213. Command/address decode 211 may capable of receiving and interpreting REFC-read, REFC-write or dummy/AR commands received from an external device (e.g., a memory controller) via command bus 203 and address bus 205. Based on that interpretation, refresh timing & management 213 may cause one or more rows of banks 215 to be refreshed during an AR interval. Refresh counter register 217 may be capable of storing a value that indicates a count for a refresh counter (not shown) for banks 215. The refresh counter may operate in a similar manner as refresh counter(s) 108 shown in FIG. 1.

According to some examples, memory device 210 may be designed to operate in accordance with the DDR4 specification, the LPDDR3 specification or the LPDDR4 specification. For these examples, an "REFC-READ" command may be implemented similar to multi-purpose register (MPR) for a DDR4 memory device 210 or a mode register read for an LPDDR3/LPDDR4 memory device 210. For example, in response to an REFC-READ command from a memory controller received by control unit 212 via command bus 205, memory device 210 may be capable of returning a value stored in refresh count register 217 on data bus 207 through mux 219 like a normal control-register read. In some examples, a REFC-READ command may be received following either an initialization of memory device 210 or following an exit of memory device 210 from a self-refresh (SR) mode. Using this access feature to memory device 210 may enable a memory controller to know what rows of banks 215 that may be refreshed or skipped for the next AR command and may also determine how many refreshes happened during the previous SR mode.

In some examples, to skip refresh operations, a memory controller coupled to memory device 210 may be able to increment a refresh counter for banks 215 without actual refresh operations to one or more rows. For these examples a "DUMMY" or "REFC-INCREMENT" command may be used to increment the refresh counter. A DUMMY or REFC-INCREMENT command may serve as a dummy-refresh and may be implemented to share the command-code (row address strobe (RAS) and column address strobe (CAS) asserted) with an "AR" command, with one address bit of the DUMMY or REFC-INCREMENT command used as a flag to differentiate it from an AR command. Since a dummy refresh causes no refresh and merely increments the refresh counter it has relatively little performance or energy overhead as compared to a refresh responsive to an AR command. Also, the memory controller may issue normal memory requests while a dummy-refresh operation is being serviced in response to a DUMMY or REFC-INCREMENT command. A dummy-refresh may be extended to cover various AR variations like per-bank for LPDDR3 or LPDDR4 compliant memory devices 210 and DDR4 fine-grained (x2,x4) options by allowing incrementing of the refresh counter to skip or not refresh a given number of rows with each DUMMY or REFC-INCREMENT command.

According to some examples, an "REFC-WRITE" command may be sent from a memory controller that may overwrite a value stored in refresh count register 217. The REFC-WRITE command, for example, may be implemented as a mode register set (MRS) command. In some examples, if memory device 210 was part of a group of memory devices included in a rank controlled by the memory controller, the REFC-WRITE command may be used to synchronize all memory devices in the rank after these devices have exited from an SR mode. In SR mode, the DRAM memory devices may separately issue refreshes based on timing events generated from their local ring oscillators. The timings of oscillators in each memory device may not be synchronized, and therefore some memory devices in the rank may issue more refreshes than others while in SR mode. In this scenario, the refresh counter values read from devices at SR exit may not match. Subsequently, a REFC-WRITE command can be used to synchronize the rank by explicitly writing a common minimum value to the refresh counters of all the memory devices in the rank.

Figure 3:
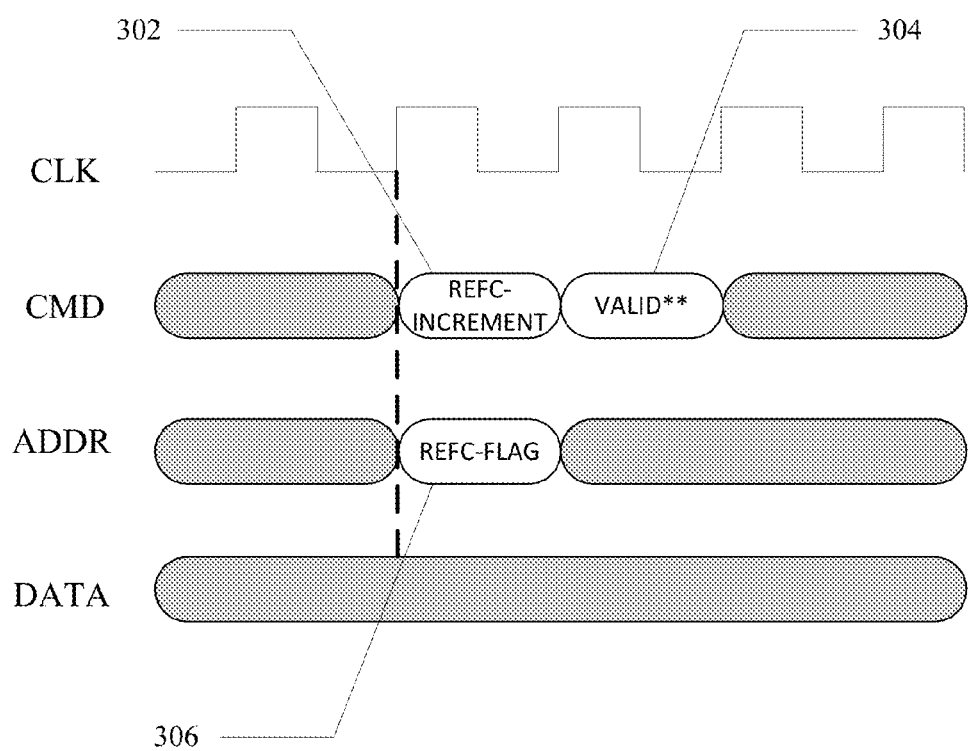
FIG. 3 illustrates an example first command.

FIG. 3 illustrates an example first command. As shown in FIG. 3, the example first command includes command 300. In some examples, command 300 may be for a DUMMY or REFC-INCREMENT command 302. For these examples, REFC-INCREMENT command 302 may be received by a control unit (e.g., control unit 212) on a command line or bus (e.g. command bus 203). The REFC-INCREMENT command 302 may be targeted to a refresh counter register identified as VALID** 304 via a same command-code as receiving AR commands. REFC-FLAG 306 shows how an address bit on an address line or bus (e.g., address bus 205) may be used as a flag to differentiate REFC-INCREMENT command 302 from an AR command.

Figure 4:
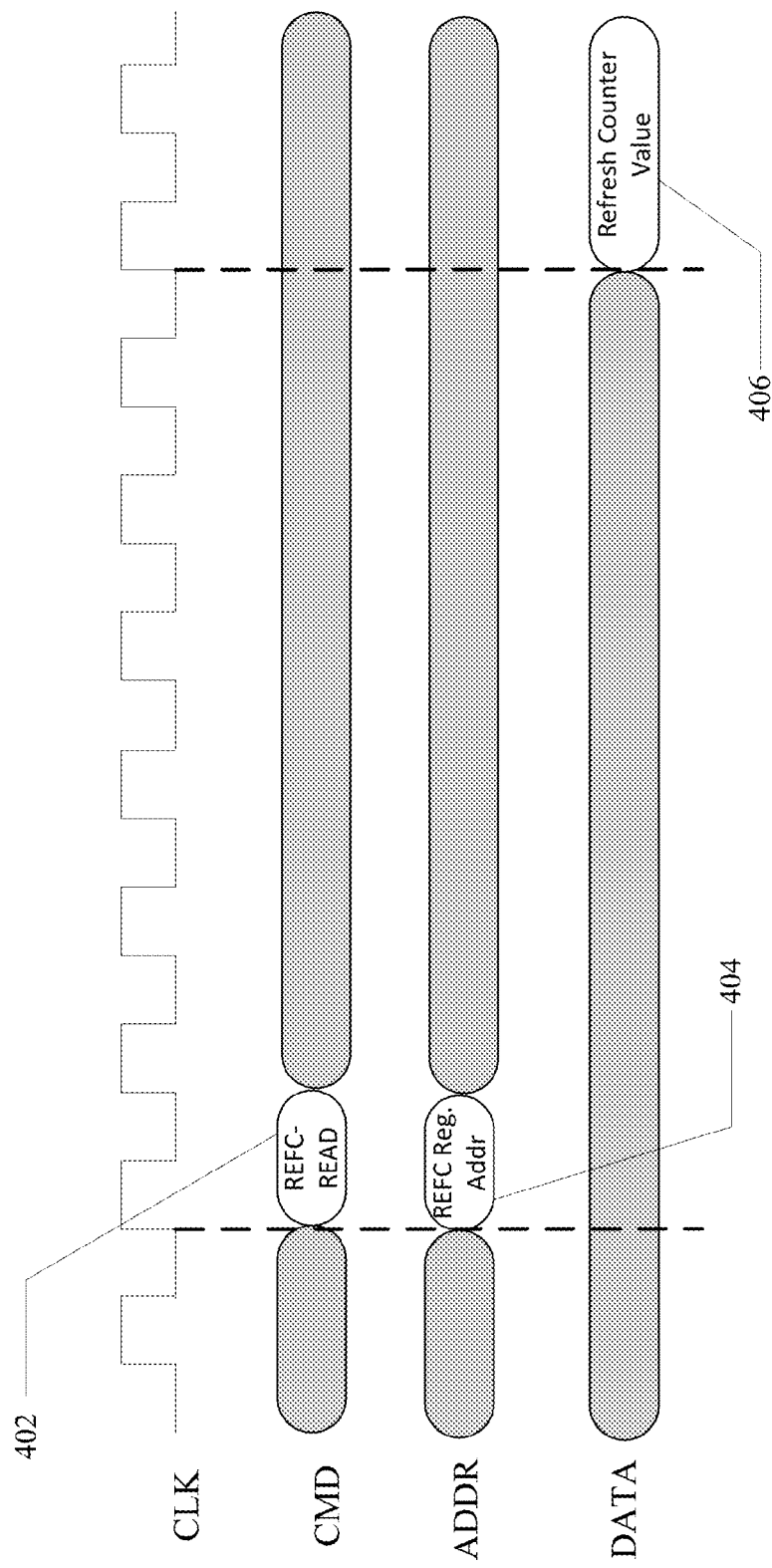
FIG. 4 illustrates an example second command.

FIG. 4 illustrates an example second command. As shown in FIG. 4, the example second command includes command 400. In some examples, command 400 may be for a REFC-READ command 402. For these examples, REFC-READ command 402 may be received by a control unit (e.g., control unit 212) on a command line or bus as shown in FIG. 4. For these examples, REFC Register Address 404 may be included on the address line bus to indicate an address for the register that is to be read (e.g., from among mode registers). Refresh counter value 406 for the addressed register may then be returned on a data bus (e.g., data bus 207) between the memory device servicing REFC-READ command 402 and the external device (e.g., a memory controller) that sent REFC-READ command 402.

Figure 5:
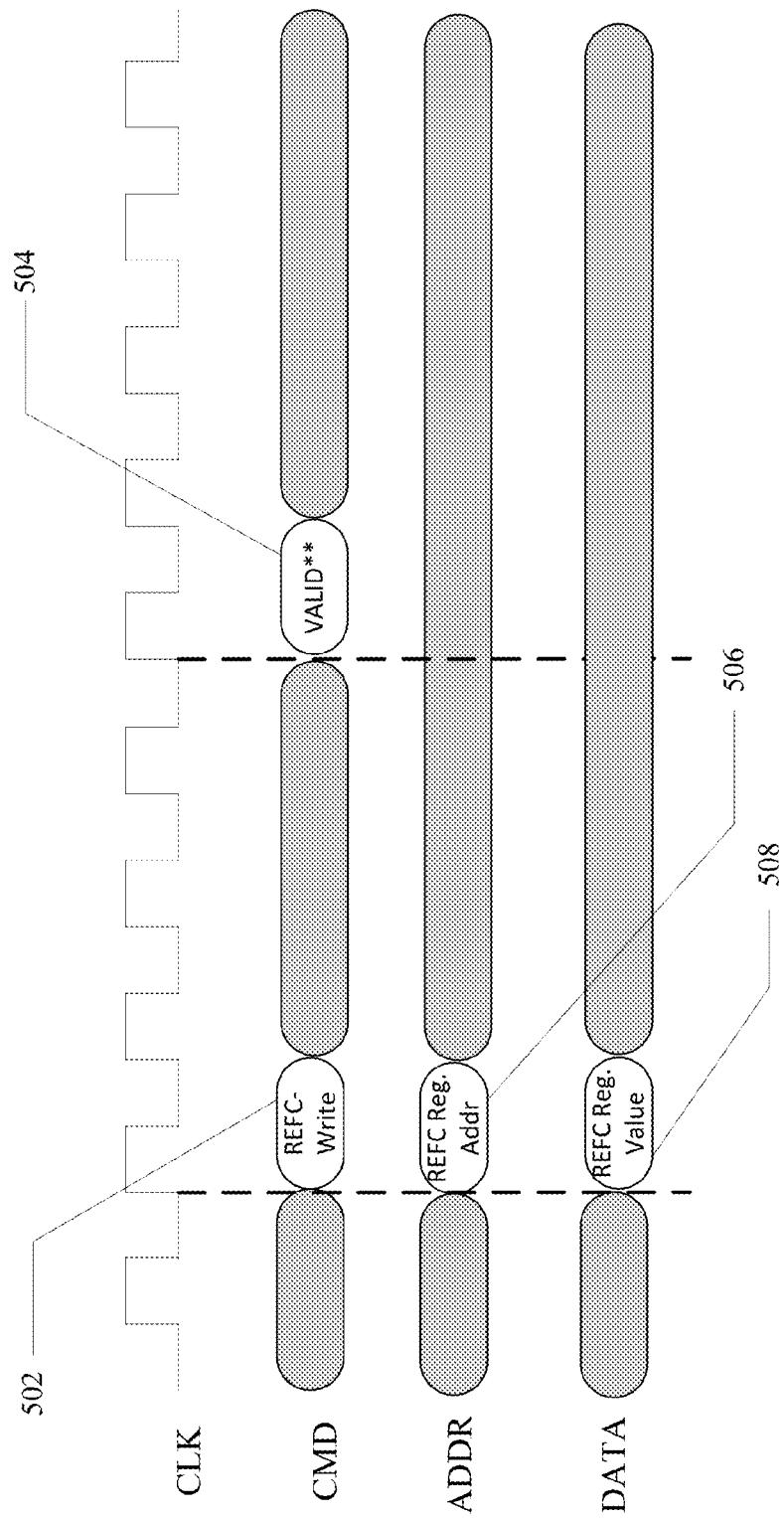
FIG. 5 illustrates an example third command.

FIG. 5 illustrates an example third command. As shown in FIG. 5, the example third command includes command 500. In some examples, command 500 may be for a REFC-WRITE command 502. For these examples, REFC-WRITE command 502 may be received by a control unit (e.g., control unit 212) on a command line or bus as shown in FIG. 5. Also, VALID** 504 may be an identifier for the refresh counter register to be overwritten. For these examples, REFC Register Address 506 may be included on the address line bus to indicate an address for the register that is to be overwritten. Refresh register value 508 may then be received on a data bus (e.g., data bus 207) between the memory device servicing REFC-WRITE command 502 and the external device (e.g., a memory controller) that sent REFC-WRITE command 502.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 6 illustrates an example of a first logic flow. As shown in FIG. 6, the first logic flow includes a logic flow 600. Logic flow 600 may be representative of some or all of the operations executed by one or more logic, features, or devices described herein, such as memory device 210. More particularly, logic flow 600 may be implemented by logic and/or features of a control unit such as control unit 212 at memory device 210.

In the illustrated example shown in FIG. 6, logic flow 600 at block 602 may receive a counter increment command from a memory controller via a same command-code as receiving AR commands. For these examples, control unit 212 may receive the counter increment command as an REFC-INCREMENT command as shown in FIG. 3. Also, in some examples, the counter increment command may have an address bit asserted to differentiate the counter increment command from a given auto-refresh command. Although other ways to differentiate the two commands may be used such as an additional command that indicates that the two commands are to be handled differently.

According to some examples, logic flow 600 at block 604 may increment a refresh counter responsive to the counter increment command that causes one or more first rows of an array of memory cells arranged in one or more banks to be skipped during an AR interval. For these examples, control unit 212 may cause the counter to be incremented.

In some examples, logic flow 600 at block 606 may store a value in a first register at the memory device that indicates a first count for the refresh counter following incrementing of the refresh counter, the first count capable of indicating remaining rows of the array of memory cells to be refreshed or skipped during the AR interval. For these examples, control unit 212 may cause the value to be stored to refresh count registers 217 to indicate remaining rows of banks 215 to be refreshed or skipped during the AR interval.

According to some examples, logic flow 600 at block 608 may receive a first AR command. For these examples, control unit 212 may receive the AR command.

In some examples, logic flow 600 at block 610 may increment the refresh counter responsive to the first AR command that causes one or more second rows of the array of memory cells to be refreshed during the AR interval. For these examples, the AR command leads to the refreshing of the one or more second rows and the refresh counter is subsequently incremented.

According to some examples, logic flow 600 at block 612 may update the value stored in the first register at the memory device that indicates a second count for the refresh counter following incrementing of the refresh counter, the second count to indicate less remaining rows of the array of memory cells to be refreshed or skipped during the AR interval as compared to the first count. For these examples, control unit 212 may update the value stored in refresh counter register 217.

FIG. 7 illustrates an example of a second logic flow. As shown in FIG. 7, the second logic flow includes a logic flow 700. Logic flow 700 may be representative of some or all of the operations executed by one or more logic, features, or devices described herein, such as memory device 210. More particularly, logic flow 700 may be implemented by logic and/or features of a control unit such as control unit 212 at memory device 210.

In the illustrated example shown in FIG. 7, logic flow 700 at block 702 may enter a self-refresh (SR) mode for the array of memory cells responsive to receiving a first power saving command. For these examples, control unit 212 may cause memory device 210 to enter the SR mode as part of entering a lower power consumption mode.

According to some examples, logic flow 700 at block 704 may increment the refresh counter based on each SR of respective one or more rows of the array of memory cells while in SR mode. For these examples, a refresh counter for memory device 210 may be capable of being incremented following each SR of the respective one or more rows of banks 115.

In some examples, logic flow 700 at block 706 may update the value stored in the first register at the memory device, each updated value to indicate a respective count for the refresh counter following each incrementing of the refresh counter. For these examples, control unit 212 may update the value stored in refresh count register 217 to indicate a respective count for the refresh counter.

According to some examples, logic flow 700 at block 708 may exit the SR mode responsive to receiving a second power saving command. For these examples, control unit 212 may cause memory device 210 to exit the SR mode.

In some examples, logic flow 700 at block 710 may receive a register read command from a memory controller coupled to memory device 210. For these examples, the register read command may be received by control unit 212 as an REFC-READ command as shown in FIG. 4.

According to some examples, logic flow 700 at block 712 may send an updated value stored in the first register responsive to the register read command. For these examples, control unit 212 may sent the updated value to the memory controller.

In some examples, logic flow 700 at block 714 may receive a register write command having a count value that causes the refresh counter to reset to a start count based on the count value. For these examples, the register write command may be received by control unit 212 as an REFC-WRITE command as shown in FIG. 5. Causing the refresh counter to reset to the start count may enable device 210 to be synchronized with one or more other memory devices included in a rank of memory devices controlled by the memory controller.

Figure 8:
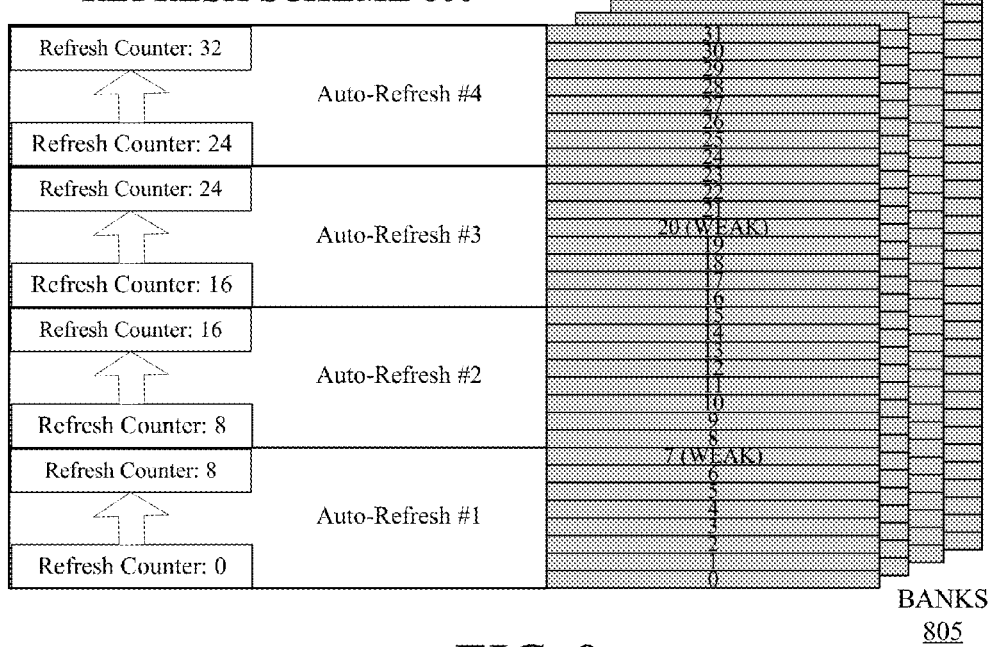
FIG. 8 illustrates an example first refresh scheme.

FIGS. 8-11 illustrate example refresh schemes to implement during an auto-refresh interval for rows of an array of memory cells arranged in one or more banks. For example, as shown in FIG. 8, a first refresh scheme 800 shows an example of a refresh scheme that includes no skipping or dummy refreshes for rows included in banks 805 during an AR interval.

Typically, DDR memory devices may have default refresh options that issue approximately 8,192 (8K) all-bank (1x granularity mode) commands in an AR interval. Two other options recently added for DDR4 memory devices increase refresh rates to 16K and 32K commands in an AR interval (2x and 4x granularity modes, respectively). These finer granularity options may decrease a number of rows refreshed or skipped responsive to a single AR or counter increment (dummy-refresh) command. For simplicity, only 32 rows of the banks for FIGS. 8-11 are shown. Also, granularity options are not limited to 1x, 2x or 4x. Other granularities that may result in even finer granularities (e.g., 16, 32, etc.) are also contemplated by this disclosure.

In some examples, as shown in FIG. 8, two rows of banks 805, row 7 and row 20, may include weak memory cells (e.g., low retention times without refresh). Rows including weak memory cells may need to be refreshed in every AR interval whereas other rows may need to be refreshed infrequently (e.g., every $4^{th}$ AR interval). Also, access information indicating how recently a row has been accessed for reading or writing may also allow an increased number of AR intervals to be skipped.

According to some examples, refresh scheme 800 shows a 1x granularity mode where each AR command causes 8 rows of bands 805 to be refreshed. Therefore, all rows of banks 805 are showed in FIG. 8 as being refreshed for auto-refresh commands #1 through #4. Also, a refresh count initially at a value 0 to indicate all rows remain to be refreshed may be incremented by a count of 8 following each refresh operation.

Figure 9:
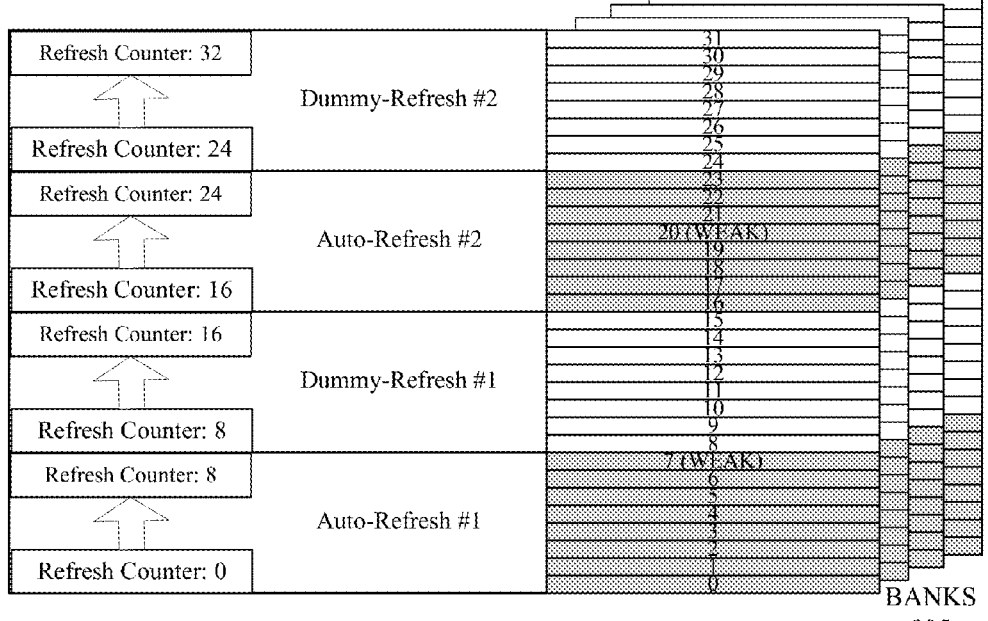
FIG. 9 illustrates an example second refresh scheme.

FIG. 9 illustrates a second refresh scheme 900 that shows a 1x granularity mode where a combination of dummy-refreshes and auto-refreshes may occur during an AR interval. In some examples, since rows 7 and 20 have the weak cells, rows 0-7 and 16-24 may be refreshed responsive to AR commands. Meanwhile, rows 8-15 and 24 to 31 may be skipped or not refreshed since they do not include weak cells. Also, as shown in FIG. 9, refresh counters are incremented following both auto-refreshes and dummy-refreshes during the AR interval.

Figure 10:
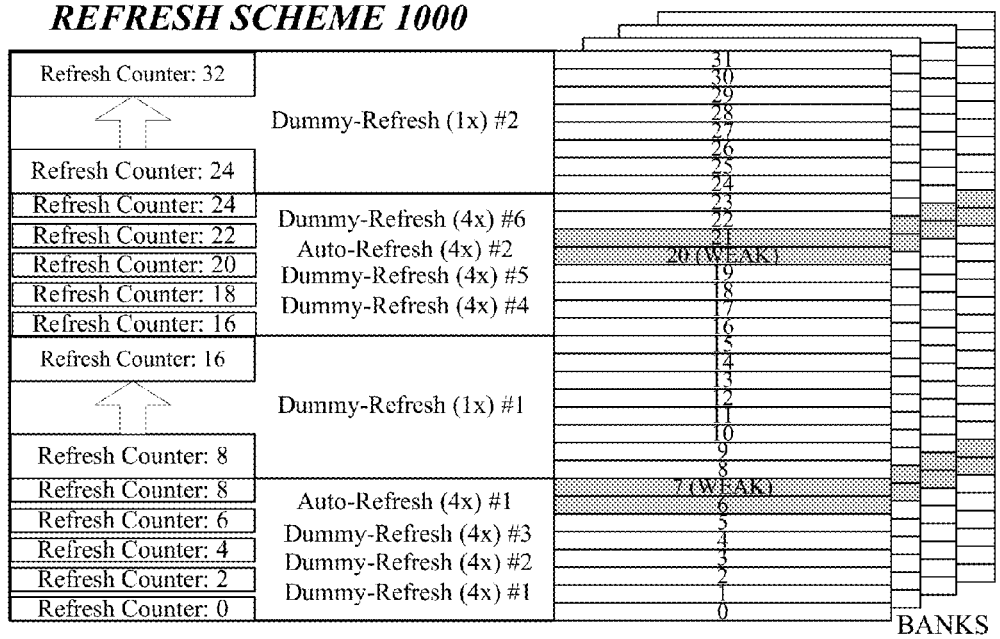
FIG. 10 illustrates an example third refresh scheme.

FIG. 10 illustrates a third refresh scheme 1000 that shows a 4x granularity mode and a 1x granularity mode where combinations of dummy-refreshes and auto-refreshes may occur during an AR interval. For example, three consecutive (4x) counter increment commands may cause dummy-refreshes (4x) #1 to #3 to skip refreshes for rows 0-5 of banks 1005 and a single (4x) AR command may cause auto-refresh (4x) #1 to refresh row 6 and row 7 that addresses the weak cell included in row 7. A single counter increment command may cause dummy-refresh (1x) #1 and result in rows 8 to 15 being skipped or not refreshed. Dummy-refreshes (4x) #4 and #5 may indicate that rows 16-19 were not refreshed or were skipped. Also, Auto-refresh (4x) #2 indicates rows 20 and 21 were refreshed to address the weak cell include in row 20. Dummy-refresh (4x) #6 and dummy-refresh (1x) #2 may result from two more increment commands causing rows 22 to 31 to be skipped or not refreshed during the AR interval. Also, as shown in FIG. 10, refresh counters are incremented following both auto-refreshes and dummy refreshes during the AR interval.

Figure 11:
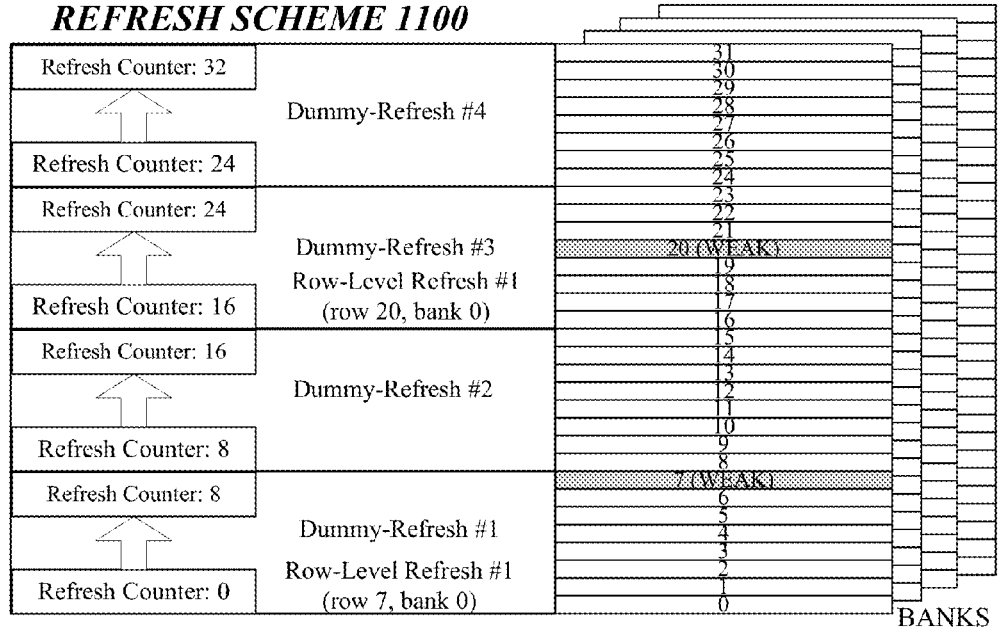
FIG. 11 illustrates an example fourth refresh scheme.

FIG. 11 illustrates a fourth refresh scheme 1100 that shows a 1x granularity mode for dummy-refreshes during an AR interval. Additionally, retention awareness techniques may be employed to identify weak rows for a given bank among banks 1105 based on historical access or retention periods associated with memory cells included in each row of banks 1105. In some examples, a memory controller may issue ACT and PRE commands to selectively refresh only weak rows 7 and 20 of bank 0. Four (1×) counter increment commands may cause dummy-refreshes #1 through #4 to skip refreshing of all but the specific rows targeted by the ACT and PRE commands.

Figure 12:
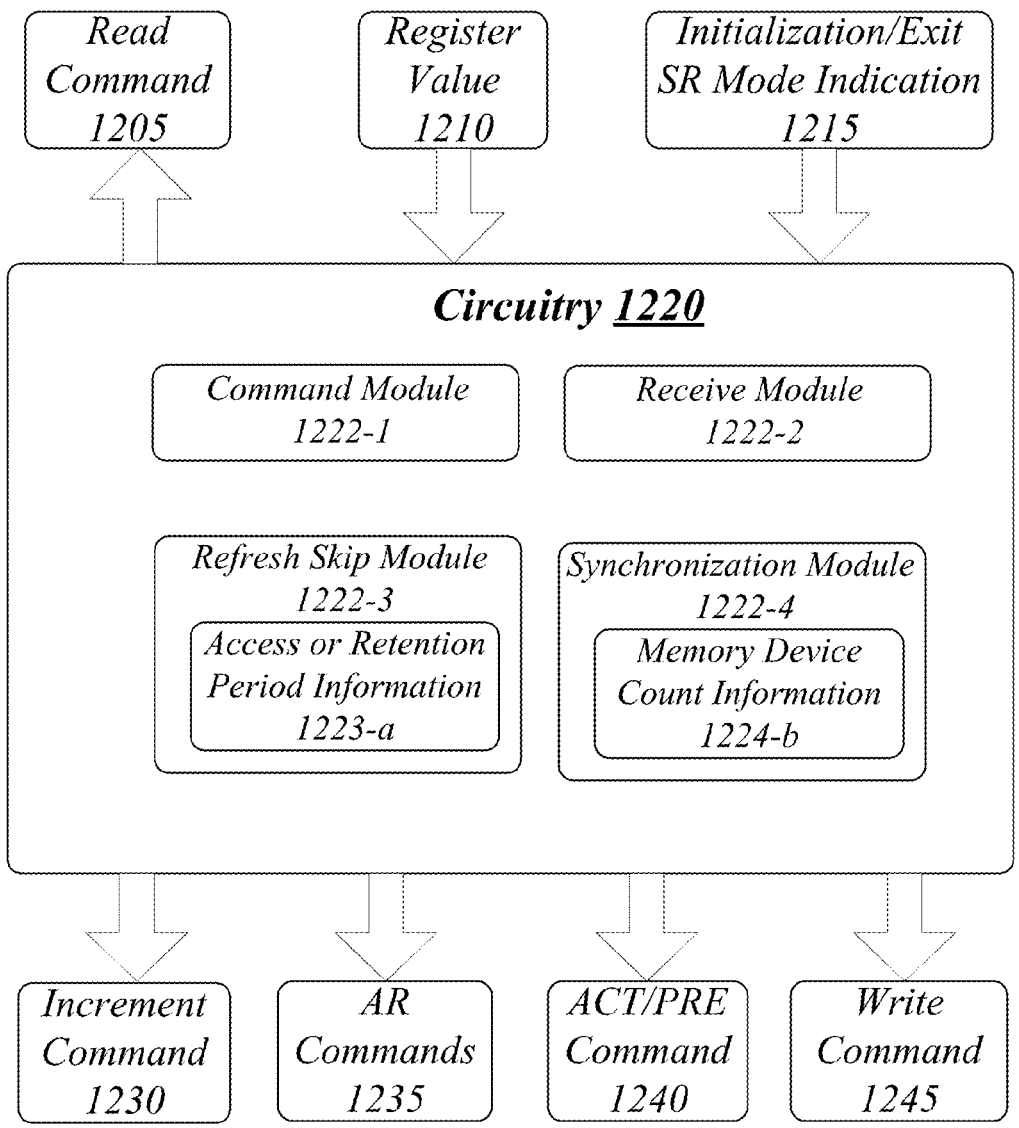
FIG. 12 illustrates an example block diagram for an apparatus.

FIG. 12 illustrates an example block diagram for a first apparatus 1200. As shown in FIG. 12, the first apparatus includes an apparatus 1200. Although apparatus 1200 shown in FIG. 12 has a limited number of elements in a certain topology, it may be appreciated that the apparatus 1200 may include more or less elements in alternate topologies as desired for a given implementation.

The apparatus 1200 may be supported by circuitry 1220 maintained at a memory controller for one or more memory devices. Circuitry 1220 may be arranged to execute one or more software or firmware implemented modules 1222-*a*. It is worthy to note that "a" and "b" and "c" and similar designators as used herein are intended to be variables representing any positive integer. Thus, for example, if an implementation sets a value for a=4, then a complete set of software or firmware for modules 1222-*a* may include modules 1222-1, 1222-2, 1222-3 or 1222-4. The examples presented are not limited in this context and the different variables used throughout may represent the same or different integer values.

According to some examples, circuitry 1220 may include a processor or processor circuitry. The processor or processor circuitry can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples circuitry 1220 may also be an application specific integrated circuit (ASIC) and at least some modules 1222-*a* may be implemented as hardware elements of the ASIC.

According to some examples, apparatus 1200 may include a command module 1222-1. Command module 1222-1 may be executed by circuitry 1220 to send a register read command to one or more memory devices that requests a first value stored in a respective refresh count register maintained at each of the one or more memory devices. For these examples, read command 1205 may include the register read command sent to the one or more memory devices.

In some examples, apparatus 1200 may also include a receive module 1222-2. Receive module 1222-2 may be executed by circuitry 1220 to receive the first value from each of the one or more memory devices. For these examples, register value 1210 may include the first value from each of the one or more memory devices.

According to some examples, apparatus 1200 may also include a refresh skip module 1222-3. Refresh skip module 1222-3 may be executed by circuitry 1220 to determine a first count for each refresh counter used by the one or more memory devices for refreshing rows of memory cells during each AR interval. For these examples, the first count may be based on the first value received by receive module 1222-2.

In some examples, skip module 1222-3 may cause command module 1222-1 to send a counter increment command included in increment command 1230 to at least one memory device from among the one or more memory devices using a same command-code as used for sending auto-refresh commands to the at least one memory device. For these examples, the counter increment command may have an address bit asserted to differentiate the counter increment command from a given auto-refresh command that may be included in AR commands 1235. The counter increment command may cause one or more first rows to be skipped for refreshing during a first AR interval for the at least one memory device. According to some examples, refresh skip module 1222-3 may maintain access or retention period information 1223-*a* in a data structure such as a lookup table (LUT). For these examples, refresh skip module 1222-3 may cause command module 1222-1 to send the count increment command based on the first count and according to access or retention period awareness. The access or retention period awareness may be based on historical information included in access or retention period information 1223-*a*.

In some examples, ACT/PRE commands included in ACT/PRE command 1240 may be sent by command module 1222-1 that are addressed to one or more second rows of memory cells for the at least one memory device. For these examples, the ACT and PRE commands may be capable of causing one or more second rows to be refreshed during the first AR interval according to the access or retention period awareness. The access or retention period awareness may be based on historical information included in access or retention period information 1223-*a*.

According to some examples, apparatus 1200 may also include a synchronization module 1222-4. Synchronization module 1222-4 may be executed by circuitry 1220 to cause command module 1222-1 to send a register write command in write command 1245 to each of the one or more memory devices. The register write command may have a count value that causes each refresh counter to reset to a same start count based on the first value received from each of the one or more memory devices. For these examples, synchronization module 1222-4 may detect an exit from an SR mode or an initialization of the one or more memory devices that may require refresh counters for each memory device to be synchronized. Initialization/exit SR mode indication 1215 may represent this detection. Count values received by receive module 1222-2 in register value 1210 may be included in memory device count information 1224-*b* (e.g., maintained in a LUT) and synchronization module 1222-4 may use those count values to determine the same start count in order to synchronize the refresh counters.

FIG. 13 illustrates an example of a third logic flow. As shown in FIG. 13 the third logic flow includes a logic flow 1300. Logic flow 1300 may be representative of some or all of the operations executed by one or more logic, features, or devices described herein, such as apparatus 1200. More particularly, logic flow 1300 may be implemented by command module 1222-1, receive module 1222-2 or refresh skip module 1222-3.

According to some examples, logic flow 1300 at block 1302 may send a register read command to one or more memory devices that requests a first value stored in a respective refresh count register maintained at each of the one or more memory devices. For these examples, command module 1222-1 may send the register read command.

In some examples, logic flow 1300 at block 1304 may receive the first value from each of the one or more memory devices. For these examples, receive module 1222-2 may receive the first value.

According to some examples, logic flow 1300 at block 1306 may determine a first count for each refresh counter used by the one or more memory devices for refreshing rows of memory cells during each AR interval. For these examples, refresh skip module 1222-3 may determine the first count.

In some examples, logic flow 1300 at block 1308 may send a counter increment command to at least one memory device from among the one or more memory devices using a same command-code as used for sending AR commands to the at least one memory device, the counter increment command causing one or more first rows to be skipped during a first AR interval for the at least one memory device. For these examples, command module 1222-1 may send the counter increment command based on information received from refresh skip module 1222-3 (e.g., based on access or retention period information 1223-a).

FIG. 14 illustrates an example of a first storage medium. As shown in FIG. 14, the first storage medium includes a storage medium 1400. The storage medium 1400 may comprise an article of manufacture. In some examples, storage medium 1400 may include any non-transitory computer readable medium or machine readable medium, such as an optical, magnetic or semiconductor storage. Storage medium 1400 may store various types of computer executable instructions, such as instructions to implement logic flow 1300. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 15:
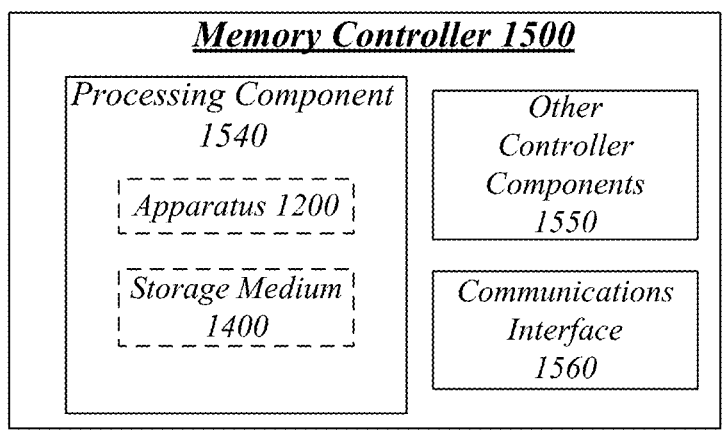
FIG. 15 illustrates an example memory controller.

FIG. 15 illustrates an example memory controller 1500. In some examples, as shown in FIG. 15, memory controller 1500 may include a processing component 1540, other platform components 1550 or a communications interface 1560. According to some examples, memory controller 1500 may be implemented in a memory controller coupled to a memory device as mentioned above.

According to some examples, processing component 1540 may execute processing operations or logic for apparatus 1200 and/or storage medium 1400. Processing component 1540 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, device drivers, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other controller components 1550 may include common computing elements or circuitry, such as one or more processors, multi-core processors, co-processors, memory units, interfaces, oscillators, timing devices, and so forth. Examples of memory units may include without limitation various types of computer readable and machine readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory or any other type of storage media suitable for storing information.

In some examples, communications interface 1560 may include logic and/or features to support a communication interface. For these examples, communications interface 1560 may include one or more communication interfaces that operate according to various communication protocols or standards to communicate over communication links or channels. Communications may occur via use of communication protocols or standards described in one or more industry standards (including progenies and variants) such as those associated with the PCI Express, SATA or SCSI standard or specifications.

The components and features of memory controller 1500 may be implemented using any combination of discrete circuitry, application specific integrated circuits (ASICs), logic gates and/or single chip architectures. Further, the features of memory controller 1500 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the example memory controller 1500 shown in the block diagram of FIG. 15 may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The follow examples pertain to additional examples of technologies disclosed herein.

Example 1

An example apparatus may include a control unit for a memory device to receive a counter increment command from a memory controller via a same command-code as receiving auto-refresh commands that refresh one or more rows of an array of memory cells arranged in one or more banks during an auto-refresh interval. The apparatus may also include a refresh counter capable of being incremented by the control unit based on the counter increment command causing one or more first rows of the array to be skipped during the auto-refresh interval. The apparatus may also include a refresh counter register capable of storing a value that indicates a first count for the refresh counter following incrementing of the refresh counter. For these examples, the first count may indicate remaining rows of the array of memory cells to be refreshed or skipped during the auto-refresh interval.

Example 2

The apparatus of example 1, the counter increment command having an address bit asserted to differentiate the counter increment command from a given auto-refresh command to refresh one or more rows of an array of memory cells arranged in one or more banks during the auto-refresh interval.

Example 3

The apparatus of example 1 may also include the control unit to receive a first auto-refresh command and the refresh counter incremented based on the first auto-refresh command causing one or more second rows of the array of memory cells to be refreshed or skipped during the auto-refresh interval. The refresh count register may store an updated value that indicates a second count for the refresh counter following incrementing of the refresh counter. For these examples, the second count may indicate less remaining rows of the array of memory cells to be refreshed or skipped during the auto-refresh interval as compared to the first count.

Example 4

The apparatus of example 1 may also include the control unit to receive an ACT command and a PRE command addressed to one or more second rows of the array of memory cells. The control unit may increment the refresh counter based on the ACT and PRE commands causing one or more second rows of the array of memory cells to be refreshed or skipped during the auto-refresh interval. The refresh count register may store an updated value that indicates a second count for the refresh counter following incrementing of the refresh counter. For these examples, the second count may indicate less remaining rows of the array of memory cells to be refreshed or skipped during the auto-refresh interval as compared to the first count.

Example 5

The apparatus of example 1, the one or more first rows of the array of memory cells may be skipped based on a granularity setting that determines a number of rows refreshed for each of a plurality of auto-refresh commands received by the control unit during the auto-refresh interval.

Example 6

The apparatus of example 4, the granularity setting may be set to cause one of eight rows, four rows or two rows to be skipped during the auto-refresh interval.

Example 7

The apparatus of example 1 may also include the control unit receiving a first power saving command and causing the memory device to enter a self-refresh mode. For these examples, the refresh counter may be incremented based on each self-refresh of respective one or more rows of the array of memory cells while in the self-refresh mode. The refresh count register may store updated values, each updated value to indicate a respective count for the refresh counter following each incrementing of the refresh counter. The control unit may cause the memory device to exit the self-refresh mode responsive to receiving a second power saving command. The control unit may then receive a register read command from the memory controller and send a most recent updated value stored in the refresh count register responsive to the register read command.

Example 8

The apparatus of example 1, the control unit may send the most recent updated value stored in the in the refresh count register on a data bus accessible to the memory controller and the control unit.

Example 9

The apparatus of example 8 may also include the control unit to receive a register write command having a count value that causes the refresh counter to reset to a start count based on the count value.

Example 10

The apparatus of example 9, the control unit may receive the count value via the data bus.

Example 11

The apparatus of example 1, the array of memory cells may be DRAM.

Example 12

An example method may include receiving, at a control unit for a memory device, a counter increment command from a memory controller via a same command-code as receiving auto-refresh commands that refresh one or more rows of an array of memory cells arranged in one or more banks during an auto-refresh interval. The method may also include incrementing a refresh counter responsive to the counter increment command that causes one or more first rows of an array of memory cells arranged in one or more banks to be skipped during an auto-refresh interval. The method may also include storing a value in a first register at the memory device that indicates a first count for the refresh counter following incrementing of the refresh counter. The first count may be capable of indicating remaining rows of the array of memory cells to be refreshed or skipped during the auto-refresh interval.

Example 13

The method of example 12, the counter increment command having an address bit asserted to differentiate the counter increment command from a given auto-refresh command to refresh one or more rows of an array of memory cells arranged in one or more banks during the auto-refresh interval.

Example 14

The method of example 12 may also include receiving a first auto-refresh command and incrementing the refresh counter responsive to the first auto-refresh command that causes one or more second rows of the array of memory cells to be refreshed or skipped during the auto-refresh interval. The may also include updating the value stored in the first register at the memory device that indicates a second count for the refresh counter following incrementing of the refresh counter. For these examples, the second count may indicate less remaining rows of the array of memory cells to be refreshed or skipped during the auto-refresh interval as compared to the first count.

Example 15

The method of example 12 may also include receiving an ACT command and a PRE command addressed to one or more second rows of the array of memory cells. The method may also include incrementing the refresh counter based on the ACT and PRE commands causing one or more second rows of the array of memory cells to be refreshed or skipped during the auto-refresh interval. The method may also include updating the value stored in the first register at the memory device that indicates a second count for the refresh counter following incrementing of the refresh counter. For these examples, the second count may indicate less remaining rows of the array of memory cells to be refreshed or skipped during the auto-refresh interval as compared to the first count.

Example 16

The method of example 12, the one or more first rows of the array of memory cells may be skipped based on a granularity setting that determines a number of rows refreshed for each of a plurality of auto-refresh commands received during the auto-refresh interval.

Example 17

The method of example 16, the granularity setting may be set to cause one of eight rows, four rows or two rows to be skipped during the auto-refresh interval.

Example 18

The method of example 12 may also include entering a self-refresh mode for the array of memory cells responsive to receiving a first power saving command. The method may also include incrementing the refresh counter based on each self-refresh of respective one or more rows of the array of memory cells while in self-refresh mode. May also include updating the value stored in the first register at the memory device. For these examples, each updated value may indicate a respective count for the refresh counter following each incrementing of the refresh counter. The method may also include exiting the self-refresh mode responsive to receiving a second power saving command, receiving a register read command from the memory controller and sending an updated value stored in the first register responsive to the register read command.

Example 19

The method of example 18 may also include sending the updated value stored in the in the first register on a data bus accessible to the memory controller and the memory device.

Example 20

The method of example 19 may also include receiving a register write command having a count value that causes the refresh counter to reset to a start count based on the count value.

Example 21

The method of example 20 may also include receiving the count value via the data bus.

Example 22

The method of example 12, the array of memory cells may be DRAM.

Example 23

An example at least one machine readable medium may include a plurality of instructions that in response to being executed by system at a host computing platform may cause the system to carry out a method according to any one of examples 12 to 22.

Example 24

An example apparatus may include means for performing the methods of any one of examples 12 to 22.

Example 25

An example at least one machine readable medium may include a plurality of instructions that in response to being executed on system at a memory device may cause the system to receive a counter increment command from a memory controller via a same command-code as receiving auto-refresh commands that refresh one or more rows of an array of memory cells arranged in one or more banks during an auto-refresh interval. The instructions may also cause the system to increment a refresh counter responsive to the counter increment command that causes one or more first rows of an array of memory cells arranged in one or more banks to be skipped during an auto-refresh interval. The instructions may also cause the system to store a value in a first register at the memory device that indicates a first count for the refresh counter following incrementing of the refresh counter. The first count may be capable of indicating remaining rows of the array of memory cells to be refreshed or skipped during the auto-refresh interval.

Example 26

The at least one machine readable medium of example 25, the counter increment command having an address bit asserted to differentiate the counter increment command from a given auto-refresh command to refresh one or more rows of an array of memory cells arranged in one or more banks during the auto-refresh interval.

Example 27

The at least one machine readable medium of example 25, the instructions may further cause the system to receive a first auto-refresh command and increment the refresh counter responsive to the first auto-refresh command that causes one or more second rows of the array of memory cells to be refreshed or skipped during the auto-refresh interval. The instructions may also cause the system to update the value stored in the first register at the memory device that indicates a second count for the refresh counter following incrementing of the refresh counter. The second count may indicate less remaining rows of the array of memory cells to be refreshed or skipped during the auto-refresh interval as compared to the first count.

Example 28

The at least one machine readable medium of example 25, the instructions may further cause the system to receive an ACT command and a PRE command addressed to one or more second rows of the array of memory cells. The instructions may also cause the system to increment the refresh counter based on the ACT and PRE commands causing one or more second rows of the array of memory cells to be refreshed or skipped during the auto-refresh interval. The instructions may also cause the system to update the value stored in the first register at the memory device that indicates a second count for the refresh counter following incrementing of the refresh counter. The second count may indicate less remaining rows of the array of memory cells to be refreshed or skipped during the auto-refresh interval as compared to the first count.

Example 29

The at least one machine readable medium of example 25, the one or more first rows of the array of memory cells may be skipped based on a granularity setting that determines a number of rows refreshed for each of a plurality of auto-refresh commands received during the auto-refresh interval.

Example 30

The at least one machine readable medium of example 29, the granularity setting may be set to cause one of eight rows, four rows or two rows to be skipped during the auto-refresh interval.

Example 31

The at least one machine readable medium of example 25, the instructions may further cause the system to enter a self-refresh mode for the array of memory cells responsive to receiving a first power saving command. The instructions may also cause the system to increment the refresh counter based on each self-refresh of respective one or more rows of the array of memory cells while in self-refresh mode. The instructions may also cause the system to update the value stored in the first register at the memory device. Each updated value may indicate a respective count for the refresh counter following each incrementing of the refresh counter. The instructions may also cause the system to exit the self-refresh mode responsive to receiving a second power saving command, receive a register read command from the memory controller and send an updated value stored in the first register responsive to the register read command.

Example 32

The at least one machine readable medium of example 31, the instructions may cause the system to send the updated value stored in the in the first register on a data bus accessible to the memory controller and the memory device.

Example 33

The at least one machine readable medium of example 32, the instructions may further cause the system to receive a register write command having a count value that causes the refresh counter to reset to a start count based on the count value.

Example 34

The at least one machine readable medium of example 32, the instructions may cause the system to receive the count value via the data bus.

Example 35

The at least one machine readable medium of example 25, the array of memory cells may be DRAM.

Example 36

An example apparatus may include circuitry for a memory controller and a command module for execution by the circuitry to send a register read command to one or more memory devices that requests a first value stored in a respective refresh count register maintained at each of the one or more memory devices. The apparatus may also include a receive module for execution by the circuitry to receive the first value from each of the one or more memory devices. The apparatus may also include a refresh skip module for execution by the circuitry to determine a first count for each refresh counter used by the one or more memory devices for refreshing rows of memory cells during each auto-refresh interval. The refresh skip module may cause the command module to send a counter increment command to at least one memory device from among the one or more memory devices using a same command-code as used for sending auto-refresh commands to the at least one memory device. For these examples, the counter increment command may cause one or more first rows to be skipped for refreshing during a first auto-refresh interval for the at least one memory device.

Example 37

The apparatus of example 36, the counter increment command having an address bit asserted to differentiate the counter increment command from a given auto-refresh command to refresh one or more rows of an array of memory cells arranged in one or more banks during the first auto-refresh interval.

Example 38

The apparatus of example 36, the receive module may receive the first value from the one or more memory devices via a data bus accessible to the memory controller and the one or more memory devices.

Example 39

The apparatus of example 36, the refresh skip module may cause the command module to send the count increment command based on the first count and based on an access or retention period awareness of each row of memory cells for the at least one memory device.

Example 40

The apparatus of example 39 may also include the command module to send an ACT command and a PRE command addressed to one or more second rows of memory cells for the at least one memory device. For these examples, the ACT and PRE commands may be capable of causing one or more second rows to be refreshed or skipped during the first auto-refresh interval based on the access or retention period awareness of each row of memory cells for the at least one memory device.

Example 41

The apparatus of example 39 may also include the command module to send a first auto-refresh command that causes one or more second rows of memory cells for the at least one memory device to be refreshed or skipped during the first auto-refresh interval based on the access or retention awareness of each row of memory cells for the at least one memory device.

Example 42

The apparatus of example 36, the command module may send the register read command responsive to the one or more memory devices exiting a self-refresh power saving mode or initialization of the one or more memory devices.

Example 43

The apparatus of example 42 may also include a synchronization module for execution by the circuitry to cause the command module to send a register write command to each of the one or more memory devices. The register write command may have a count value that causes each refresh counter to reset to a same start count based on the first value received from each of the one or more memory devices.

Example 44

The apparatus of example 43, the count value may be sent by the command module via a data bus accessible to the memory controller and each of the one or more memory devices.

Example 45

The apparatus of example 36 may also include a digital display coupled to the circuitry to present a user interface view.

Example 46

An example method may include sending, at a memory controller, a register read command to one or more memory devices that requests a first value stored in a respective refresh count register maintained at each of the one or more memory devices. The method may also include receiving the first value from each of the one or more memory devices. The method may also include determining a first count for each refresh counter used by the one or more memory devices for refreshing rows of memory cells during each auto-refresh interval. The method may also include sending a counter increment command to at least one memory device from among the one or more memory devices using a same command-code as used for sending auto-refresh commands to the at least one memory device. The counter increment command may cause one or more first rows to be skipped during a first auto-refresh interval for the at least one memory device.

Example 47

The method of example 46, the counter increment command having an address bit asserted to differentiate the counter increment command from a given auto-refresh command to refresh one or more rows of an array of memory cells arranged in one or more banks during the first auto-refresh interval.

Example 48

The method of example 46 may also include receiving the first value from the one or more memory devices via a data bus accessible to the memory controller and the one or more memory devices.

Example 49

The method of example 46 may also include the count increment command sent based on the first count and based on an access or retention period awareness of each row of memory cells for the at least one memory device.

Example 50

The method of example 49 may also include sending an ACT command and a PRE command addressed to one or more second rows of memory cells for the at least one memory device. For these examples, the ACT and PRE commands may be capable of causing one or more second rows to be refreshed or skipped during the first auto-refresh interval based on the access or retention period awareness of each row of memory cells for the at least one memory device.

Example 51

The method of example 50 may also include sending a first auto-refresh command that causes one or more second rows of memory cells for the at least one memory device to be refreshed or skipped during the first auto-refresh interval based on the access or retention awareness of each row of memory cells for the at least one memory device.

Example 52

The method of example 51 may also include sending the register read command responsive to the one or more memory devices exiting a self-refresh power saving mode or initialization of the one or more memory devices.

Example 53

The method of example 52 may also include sending a register write command to each of the one or more memory devices. The register write command may have a count value that causes each refresh counter to reset to a same start count based on the first value received from each of the one or more memory devices.

Example 54

The method of example 53, the count value may be sent via a data bus accessible to the memory controller and each of the one or more memory devices.

Example 55

An example at least one machine readable medium may include a plurality of instructions that in response to being executed by system may cause the system to carry out a method according to any one of examples 46 to 54.

Example 56

An example apparatus may include means for performing the methods of any one of examples 46 to 54.

Example 57

An example at least one machine readable medium may include a plurality of instructions that in response to being executed on system at a memory controller may cause the system to send a register read command to one or more memory devices that requests a first value stored in a respective refresh count register maintained at each of the one or more memory devices. The instructions may also cause the system to receive the first value from each of the one or more memory devices. The instructions may also cause the system to determine a first count for each refresh counter used by the one or more memory devices for refreshing rows of memory cells during each auto-refresh interval. The instructions may also cause the system to send a counter increment command to at least one memory device from among the one or more memory devices using a same command-code as used for sending auto-refresh commands to the at least one memory device. For these examples, the counter increment command causing one or more first rows to be skipped during a first auto-refresh interval for the at least one memory device.

Example 58

The at least one machine readable medium of method 57, the counter increment command having an address bit asserted to differentiate the counter increment command from a given auto-refresh command to refresh one or more rows of an array of memory cells arranged in one or more banks during the first auto-refresh interval.

Example 59

The at least one machine readable medium of example 57, the instructions may also cause the system to receive the first value from the one or more memory devices via a data bus accessible to the memory controller and the one or more memory devices.

Example 60

The at least one machine readable medium of example 57, the instructions may also cause the system to send the count increment command based on the first count and based on an access or retention period awareness of each row of memory cells for the at least one memory device.

Example 61

The at least one machine readable medium of example 60, the instructions may further cause the system to send an ACT command and a PRE command addressed to one or more second rows of memory cells for the at least one memory device. The ACT and PRE commands may be capable of causing one or more second rows to be refreshed or skipped during the first auto-refresh interval based on the access or retention period awareness of each row of memory cells for the at least one memory device.

Example 62

The at least one machine readable medium of example 60, the instructions may further cause the system to send a first auto-refresh command that causes one or more second rows of memory cells for the at least one memory device to be refreshed or skipped during the first auto-refresh interval based on the access or retention awareness of each row of memory cells for the at least one memory device.

Example 63

The at least one machine readable medium of example 57, the instructions may cause the system to send the register read command responsive to the one or more memory devices exiting a self-refresh power saving mode or initialization of the one or more memory devices.

Example 64

The at least one machine readable medium of example 63, the instructions may further cause the system to send a register write command to each of the one or more memory devices. The register write command may have a count value that causes each refresh counter to reset to a same start count based on the first value received from each of the one or more memory devices.

Example 65

The at least one machine readable medium of example 64, the instructions may cause the system to send the count value via a data bus accessible to the memory controller and each of the one or more memory devices.

Example 66

An example system may include one or more memory devices and a computing platform coupled to the one or more memory device. The computing platform may have a memory controller to send a register read command to the one or more memory devices that requests a first value stored in a respective refresh count register maintained at each of the one or more memory device. The memory control may also receive the first value from each of the one or more memory devices and determine a first count for each refresh counter used by the one or more memory devices for refreshing rows of memory cells during each auto-refresh interval. The memory control may also send a counter increment command to at least one memory device from among the one or more memory devices using a same command-code as used for sending auto-refresh commands to the at least one memory device. The counter increment command may cause one or more first rows to be skipped during a first auto-refresh interval for the at least one memory device.

Example 67

The system of example 66, the counter increment command having an address bit asserted to differentiate the counter increment command from a given auto-refresh command to refresh one or more rows of an array of memory cells arranged in one or more banks during the first auto-refresh interval.

Example 68

The system of example 66, the memory control may also receive the first value from the one or more memory devices via a data bus accessible to the memory controller and the one or more memory devices.

Example 69

The system of example 66, the memory control may also send the count increment command based on the first count and based on an access or retention period awareness of each row of memory cells for the at least one memory device.

Example 70

The system of example 69, the memory control may also send an ACT command and a PRE command addressed to one or more second rows of memory cells for the at least one memory device. For these examples, the ACT and PRE commands may be capable of causing one or more second rows to be refreshed or skipped during the first auto-refresh interval based on the access or retention period awareness of each row of memory cells for the at least one memory device.

Example 71

The system of example 69, the memory control may also send a first auto-refresh command that causes one or more second rows of memory cells for the at least one memory device to be refreshed or skipped during the first auto-refresh interval based on the access or retention awareness of each row of memory cells for the at least one memory device.

Example 72

The system of example 66, the memory control may also send the register read command responsive to the one or more memory devices exiting a self-refresh power saving mode or initialization of the one or more memory devices.

Example 73

The system of example 72, the memory control may also send a register write command to each of the one or more memory devices. The register write command having a count value that may cause each refresh counter to reset to a same start count based on the first value received from each of the one or more memory devices.

Example 74

The system of example 73, memory control may also send the count value via a data bus accessible to the memory controller and each of the one or more memory devices.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
   a control unit for a memory device to receive a counter increment command from a memory controller via a same command-code as receiving auto-refresh commands that refresh one or more rows of an array of memory cells arranged in one or more banks during an auto-refresh interval;
   a refresh counter capable of being incremented by the control unit based on the counter increment command causing one or more first rows of the array to be skipped during the auto-refresh interval; and
   a refresh counter register capable of storing a value that indicates a first count for the refresh counter following incrementing of the refresh counter, the first count to indicate remaining rows of the array of memory cells to be refreshed or skipped during the auto-refresh interval.

2. The apparatus of claim 1, comprising:
   the control unit to receive a first auto-refresh command;
   the refresh counter incremented based on the first auto-refresh command causing one or more second rows of the array of memory cells to be refreshed or skipped during the auto-refresh interval; and
   the refresh count register to store an updated value that indicates a second count for the refresh counter following incrementing of the refresh counter, the second count to indicate less remaining rows of the array of memory cells to be refreshed or skipped during the auto-refresh interval as compared to the first count.

3. The apparatus of claim 1, comprising:
   the control unit to receive an activation (ACT) command and a precharge (PRE) command addressed to one or more second rows of the array of memory cells;
   the control unit to increment the refresh counter based on the ACT and PRE commands causing one or more second rows of the array of memory cells to be refreshed or skipped during the auto-refresh interval; and
   the refresh count register to store an updated value that indicates a second count for the refresh counter following incrementing of the refresh counter, the second count to indicate less remaining rows of the array of memory cells to be refreshed or skipped during the auto-refresh interval as compared to the first count.

4. The apparatus of claim 1, the one or more first rows of the array of memory cells to be skipped based on a granularity setting that determines a number of rows refreshed for each of a plurality of auto-refresh commands received by the control unit during the auto-refresh interval.

5. The apparatus of claim 4, comprising the granularity setting being set to cause one of eight rows, four rows or two rows to be skipped during the auto-refresh interval.

6. The apparatus of claim 1, comprising:
   the control unit to receive a first power saving command and cause the memory device to enter a self-refresh mode;
   the refresh counter incremented based on each self-refresh of respective one or more rows of the array of memory cells while in the self-refresh mode;
   the refresh count register to store updated values, each updated value to indicate a respective count for the refresh counter following each incrementing of the refresh counter;
   the control unit to cause the memory device to exit the self-refresh mode responsive to receiving a second power saving command; and
   the control unit to receive a register read command from the memory controller and send a most recent updated value stored in the refresh count register responsive to the register read command.

7. The apparatus of claim 1, the control unit to send the most recent updated value stored in the refresh count register on a data bus accessible to the memory controller and the control unit.

8. The apparatus of claim 7, comprising:
   the control unit to receive a register write command having a count value that causes the refresh counter to reset to a start count based on the count value.

9. The apparatus of claim 8, the control unit to receive the count value via the data bus.

10. The apparatus of claim 1, the array of memory cells comprising dynamic random access memory (DRAM).

11. A method comprising:
    receiving, at a control unit for a memory device, a counter increment command from a memory controller via a same command-code as receiving auto-refresh commands that refresh one or more rows of an array of memory cells arranged in one or more banks during an auto-refresh interval;
    incrementing a refresh counter responsive to the counter increment command that causes one or more first rows of an array of memory cells arranged in one or more banks to be skipped during an auto-refresh interval; and
    storing a value in a first register at the memory device that indicates a first count for the refresh counter following incrementing of the refresh counter, the first count capable of indicating remaining rows of the array of memory cells to be refreshed or skipped during the auto-refresh interval.

12. The method of claim 11, comprising:
    receiving a first auto-refresh command;
    incrementing the refresh counter responsive to the first auto-refresh command that causes one or more second rows of the array of memory cells to be refreshed or skipped during the auto-refresh interval; and
    updating the value stored in the first register at the memory device that indicates a second count for the refresh counter following incrementing of the refresh counter, the second count to indicate less remaining rows of the array of memory cells to be refreshed or skipped during the auto-refresh interval as compared to the first count.

13. The method of claim 11, comprising:
receiving an activation (ACT) command and a precharge (PRE) command addressed to one or more second rows of the array of memory cells;
incrementing the refresh counter based on the ACT and PRE commands causing one or more second rows of the array of memory cells to be refreshed or skipped during the auto-refresh interval; and
updating the value stored in the first register at the memory device that indicates a second count for the refresh counter following incrementing of the refresh counter, the second count to indicate less remaining rows of the array of memory cells to be refreshed or skipped during the auto-refresh interval as compared to the first count.

14. The method of claim 11, comprising:
entering a self-refresh mode for the array of memory cells responsive to receiving a first power saving command;
incrementing the refresh counter based on each self-refresh of respective one or more rows of the array of memory cells while in self-refresh mode;
updating the value stored in the first register at the memory device, each updated value to indicate a respective count for the refresh counter following each incrementing of the refresh counter;
exiting the self-refresh mode responsive to receiving a second power saving command;
receiving a register read command from the memory controller; and
sending an updated value stored in the first register responsive to the register read command.

15. An apparatus comprising:
circuitry for a memory controller;
a command module for execution by the circuitry to send a register read command to one or more memory devices that requests a first value stored in a respective refresh count register maintained at each of the one or more memory devices;
a receive module for execution by the circuitry to receive the first value from each of the one or more memory devices;
a refresh skip module for execution by the circuitry to determine a first count for each refresh counter used by the one or more memory devices for refreshing rows of memory cells during each auto-refresh interval; and
the refresh skip module to cause the command module to send a counter increment command to at least one memory device from among the one or more memory devices using a same command-code as used for sending auto-refresh commands to the at least one memory device, the counter increment command to cause one or more first rows to be skipped for refreshing during a first auto-refresh interval for the at least one memory device.

16. The apparatus of claim 15, the receive module to receive the first value from the one or more memory devices via a data bus accessible to the memory controller and the one or more memory devices.

17. The apparatus of claim 15, the refresh skip module to cause the command module to send the count increment command based on the first count and based on an access or retention period awareness of each row of memory cells for the at least one memory device.

18. The apparatus of claim 17, comprising:
the command module to send an activation (ACT) command and a precharge (PRE) command addressed to one or more second rows of memory cells for the at least one memory device, the ACT and PRE commands capable of causing one or more second rows to be refreshed or skipped during the first auto-refresh interval based on the access or retention period awareness of each row of memory cells for the at least one memory device.

19. The apparatus of claim 17, comprising:
the command module to send a first auto-refresh command that causes one or more second rows of memory cells for the at least one memory device to be refreshed or skipped during the first auto-refresh interval based on the access or retention awareness of each row of memory cells for the at least one memory device.

20. The apparatus of claim 15, the command module to send the register read command responsive to the one or more memory devices exiting a self-refresh power saving mode or initialization of the one or more memory devices.

21. A system comprising:
one or more memory devices; and
a computing platform coupled to the one or more memory device, the computing platform having a memory controller to:
send a register read command to the one or more memory devices that requests a first value stored in a respective refresh count register maintained at each of the one or more memory devices;
receive the first value from each of the one or more memory devices;
determine a first count for each refresh counter used by the one or more memory devices for refreshing rows of memory cells during each auto-refresh interval; and
send a counter increment command to at least one memory device from among the one or more memory devices using a same command-code as used for sending auto-refresh commands to the at least one memory device, the counter increment command causing one or more first rows to be skipped during a first auto-refresh interval for the at least one memory device.

22. The system of claim 21, the counter increment command having an address bit asserted to differentiate the counter increment command from a given auto-refresh command to refresh one or more rows of an array of memory cells arranged in one or more banks during the first auto-refresh interval.

23. The system of claim 21, comprising the memory controller to:
send the count increment command based on the first count and based on an access or retention period awareness of each row of memory cells for the at least one memory device; and
send a first auto-refresh command that causes one or more second rows of memory cells for the at least one memory device to be refreshed or skipped during the first auto-refresh interval based on the access or retention awareness of each row of memory cells for the at least one memory device.

24. The system of claim 21, the memory controller to send the register read command responsive to the one or more memory devices exiting a self-refresh power saving mode or initialization of the one or more memory devices.

25. The system of claim 24, the memory controller to:
send a register write command to each of the one or more memory devices, the register write command having a count value that causes each refresh counter to reset to a same start count based on the first value received from each of the one or more memory devices.

* * * * *